(12) United States Patent
Oyabu

(10) Patent No.: US 6,508,199 B1
(45) Date of Patent: Jan. 21, 2003

(54) PLASMA PROCESSING APPARATUS

(75) Inventor: Jun Oyabu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 93 days.

(21) Appl. No.: 09/640,393

(22) Filed: Aug. 16, 2000

(30) Foreign Application Priority Data

Aug. 17, 1999 (JP) .......................................... 11-230567

(51) Int. Cl.[7] ..................... C23C 16/509; C23C 16/505; C23C 16/503
(52) U.S. Cl. ................. 118/723 E; 118/723 R; 118/729; 118/725; 156/345.43; 156/345.44; 156/345.47
(58) Field of Search ......................... 117/103; 118/715, 118/719, 723 E, 723 MP, 723 R, 725; 134/1.1, 1.2, 1.3; 156/345; 219/121.4, 121.43, 121.52

(56) References Cited

U.S. PATENT DOCUMENTS

| | | | | |
|---|---|---|---|---|
| 4,842,683 A | * | 6/1989 | Cheng et al. | 156/345 |
| 5,078,851 A | * | 1/1992 | Nishihata et al. | 204/298.34 |
| 5,815,366 A | * | 9/1998 | Morita et al. | 361/234 |
| 5,838,528 A | * | 11/1998 | Os et al. | 361/234 |
| 5,880,924 A | * | 3/1999 | Kumar et al. | 361/234 |
| 5,914,568 A | * | 6/1999 | Nonaka | 315/111.21 |
| 5,919,332 A | * | 7/1999 | Koshiishi et al. | 156/345 |
| 6,057,244 A | * | 5/2000 | Hausmann et al. | 438/706 |
| 6,074,538 A | * | 6/2000 | Ohmi et al. | 204/298.06 |
| 6,162,323 A | * | 12/2000 | Koshimizu | 156/345 |
| 6,207,558 B1 | * | 3/2001 | Singhvi et al. | 438/648 |
| 6,221,221 B1 | * | 4/2001 | Al-Shaikh et al. | 204/298.02 |
| 6,235,146 B1 | * | 5/2001 | Kadotani et al. | 156/345 |
| 6,264,788 B1 | * | 7/2001 | Tomoyasu et al. | 156/345 |
| 2002/0019144 A1 | * | 2/2002 | Kim et al. | 438/771 |

FOREIGN PATENT DOCUMENTS

| JP | 3-291928 | 12/1991 |
|---|---|---|
| JP | 8-335568 | 12/1996 |

OTHER PUBLICATIONS

Translation for JP08–335568—http://www.ipdl.jpo.go.jp/homepg_e.ipdl.*

* cited by examiner

Primary Examiner—Gregory Mills
Assistant Examiner—Rudy Zervigon
(74) Attorney, Agent, or Firm—Finnegan, Henderson, Farabow, Garrett, and Dunner, L.L.P.

(57) ABSTRACT

Inside a processing chamber 102 of an etching apparatus 100, a pair of electrodes, i.e., an upper electrode 118 and a lower electrode 106, are provided. The circumferential edge of the upper electrode 118 is covered by a first ring-shaped body 122, and a cylindrical body 124 is provided around the first ring-shaped body 122. A second ring-shaped body 116 is provided around the lower electrode 106. When the lower electrode 106 is set at the processing position, the second ring-shaped body 116 is positioned inside the cylindrical body 124 to form a plasma space 102a. A gas discharge path 142 is formed between the cylindrical body 124 and the second ring-shaped body 116. The distance between the cylindrical body 124 and the second ring-shaped body 116 is set so as to ensure that the conductance value of the gas inside the gas discharge path 142 is higher than the conductance value of the gas inside the plasma space 102a. The cylindrical body 124 and the first and second ring-shaped bodies 122 and 116 are heated by the plasma. As a result, a plasma processing apparatus capable of inducing plasma to a workpiece uniformly while creating only a small quantity of particles is provided.

12 Claims, 2 Drawing Sheets

PLASMA PROCESSING APPARATUS

BACKGROUND OF THE INVENTION

1. Field of the Invention

The present invention relates to a plasma processing apparatus.

2. Description of the Related Art

A plasma processing apparatus is conventionally employed in the process of manufacturing semiconductor devices. Such a plasma processing apparatus is provided with an upper electrode and a lower electrode facing opposite each other inside a processing chamber. In a plasma processing apparatus adopting this structure, the processing gas induced into the processing chamber is raised to plasma by applying high-frequency power to the upper electrode and the lower electrode so that plasma processing may be performed on a workpiece placed on the lower electrode.

In the apparatus in the prior art described above, plasma is diffused inside the processing chamber during the process. This causes deposition attributable to the plasma to become adhered to the inner wall surfaces of the processing chamber and the surfaces of the various members exposed inside the processing chamber. In addition, when such deposition is accumulated to a certain degree, the deposition begins to peel off to become loose particles which will contaminate the workpiece. As a result, the apparatus in the prior art necessitates frequent cleaning to remove the deposits, which in turn lowers the throughput.

Openings such as a gas discharge port through which the gas inside the processing chamber is discharged and a detection port through which plasma light is detected are normally formed at an inner wall of the processing chamber. The presence of these openings poses a problem in that plasma is generated in a nonuniform manner and consequently, uniform processing cannot be performed on the workpiece.

Furthermore, in the prior art, the distance between the upper electrode and the lower electrode is adjusted in order to optimize the plasma in conformance to the particulars of a given process. However, there is a problem with an apparatus adopting the structure in the prior art in that if the distance between the electrodes is changed, the conductance at the gas discharge path also changes, to result in plasma becoming unstable.

SUMMARY OF THE INVENTION

An object of the present invention, which has been completed by addressing the problems of the prior art discussed above, is to provide a new and improved plasma processing apparatus capable of eliminating the problems discussed above and other problems.

In order to achieve the object described above, the present invention provides a plasma processing apparatus having a first electrode and a second electrode facing opposite each other inside a processing chamber into which a processing gas is induced with plasma being generated between the first electrode and the second electrode by applying high-frequency power in order to perform a plasma process on a workpiece placed on the second electrode. The plasma processing apparatus is provided with a first ring-shaped body that covers the circumferential edge of the first electrode, a cylindrical body that is provided around the first ring-shaped body to surround the workpiece during a plasma process and a second ring-shaped body that is provided around the second electrode and is positioned inside the cylindrical body during the plasma process, with a gas discharge path formed between the cylindrical body and the second ring-shaped body during the plasma process.

According to the present invention, the plasma is prevented from becoming diffused onto the processing chamber inner walls by the cylindrical body and the second ring-shaped body during the plasma process. As a result, almost no deposits adhere to the processing chamber inner wall surfaces. In addition, the first and second ring-shaped bodies and the cylindrical body are exposed to the plasma and become heated during the process. Thus, even though the first ring-shaped body, the second ring-shaped body and the cylindrical body are exposed to the plasma, deposits do not adhere to them readily. Consequently, the intervals between maintenance required to remove deposits can be lengthened to improve productivity.

In addition, during the plasma process, it is desirable to set the distance between the cylindrical body and the second ring-shaped body so as to ensure that the conductance value of the gas within the gas discharge path is larger than the conductance value of the gas inside the space where plasma is generated. By ensuring this, the gas flow is deterred to a certain extent in the gas discharge path to rectify the flow of the gas inside the space. As a result, a uniform plasma flow is achieved to induce the plasma to the workpiece in a uniform manner. Thus, the workpiece can be uniformly processed.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED IMPLEMENTATION EXAMPLE

The following is a detailed explanation of a preferred implementation example achieved by adopting the plasma processing apparatus according to the present invention in a plasma etching apparatus, given in reference to the attached drawings.

1. Overall Structure of Etching Apparatus

Figure 1:
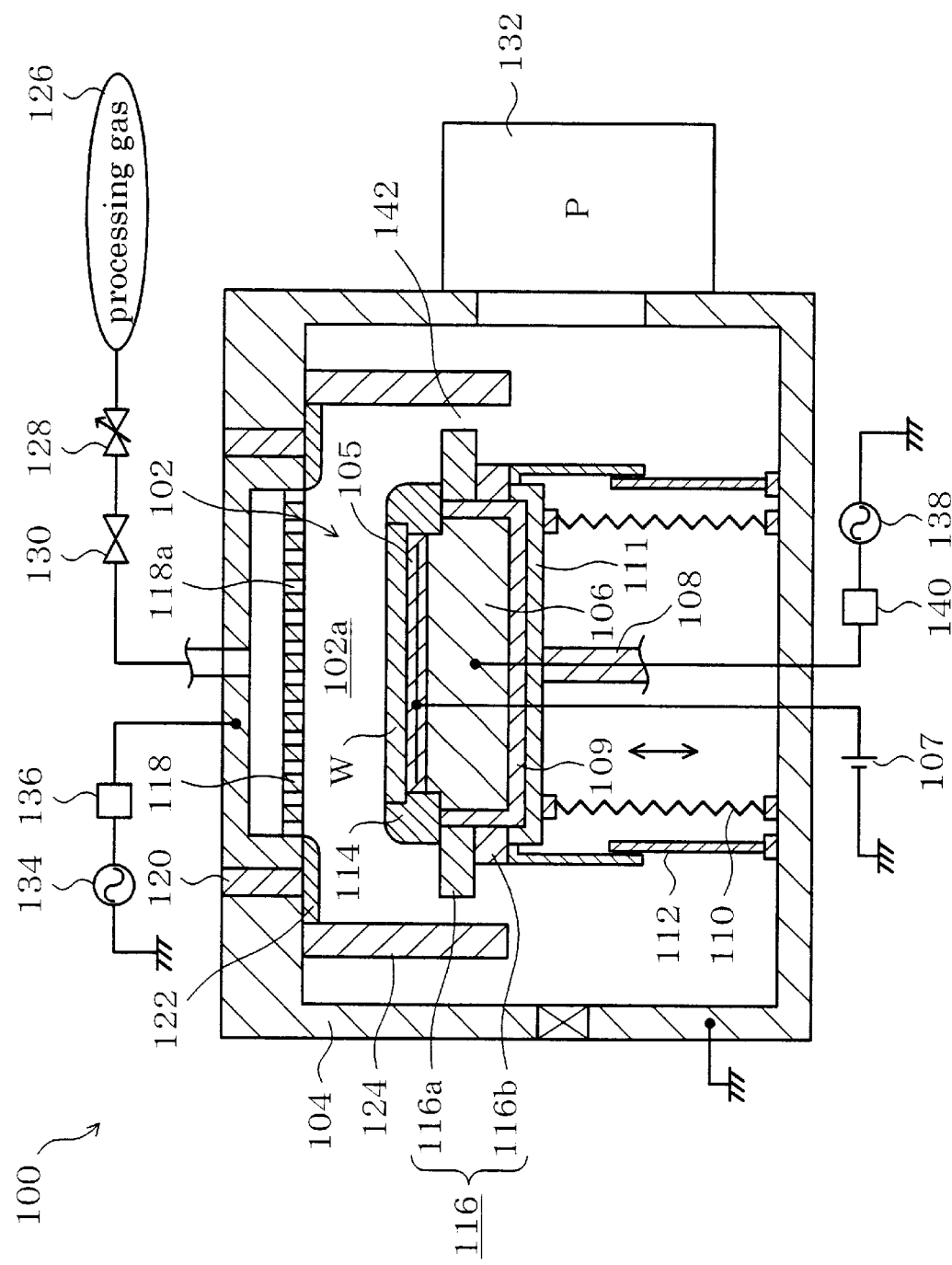
FIG. 1 is a schematic sectional view of an etching apparatus that may adopt the present invention.

First, the structure of an etching apparatus 100 is briefly explained. As shown in FIG. 1, a processing chamber 102 is formed inside an airtight processing container 104. Inside the processing chamber 102, a lower electrode (second electrode) 106 is provided. The lower electrode 106 also functions as a stage on which a workpiece such as a semiconductor wafer (hereafter referred to as a wafer) W is placed. In addition, an electrostatic chuck 105 is provided at the mounting surface of the lower electrode 106 on which the wafer W is placed. In this structure, the wafer W placed on the electrostatic chuck 105 is vacuum held when a high voltage DC voltage output from a high voltage DC source 107 is applied to the electrostatic chuck 105. Furthermore, an elevator shaft 108 is connected to the lower electrode 106 via an insulating member 109 and a conductive member 111. As a result, the lower electrode 106 is allowed to move up and down freely via the elevator shaft 108 when it is driven by a drive mechanism (not shown). Around the elevator shaft 108, a bellows 110 is provided to sustain airtightness inside the processing chamber 102. The bellows 110 is enclosed by a bellows cover 112. Moreover, the bellows 110 and the bellows cover 112 are individually connected with the conductive member 111.

In addition, a focus ring 114 is provided at the lower electrode 106. The focus ring 114, which may be constituted of, for instance, a quartz ring-shaped member, is set so as to surround the electrostatic chuck 105 and the wafer W placed on the electrostatic chuck 105. A second ring-shaped body 116 in the implementation example is provided at the lower electrode 106 via the insulating member 109 as well. It is to be noted that the structure of the second ring-shaped body 116 is to be described in detail below.

Furthermore, an upper electrode (first electrode) 118 is provided so as to face opposite the lower electrode 106 inside the processing chamber 102. The upper electrode 118 is provided at the processing container 104 via an insulating member 120. The circumferential edge of the upper electrode 118 is covered by a first ring-shaped body (shield ring) 122 in the implementation example. The first ring-shaped body 122 is constituted of an insulating material, e.g., a roughly ring-shaped member constituted of quartz. By adopting such a structure, in which the circumferential edge of the upper electrode 118 is not exposed to plasma, it is ensured that the circumferential edge is protected from damage. In addition, a cylindrical body 124 in the implementation example is provided around the first ring-shaped body 122. In the example illustrated in the figure, the first ring-shaped body 122 constitutes the inner wall surface of the processing chamber extending from the upper electrode 118 to the cylindrical body 124. It is to be noted that the structure of the cylindrical body 124 is to be detailed later.

Next, an etching process performed with the etching apparatus 100 is explained. First, a processing gas such as CF gas is induced into the processing chamber 102. The flow rate of the gas which is supplied from a processing gas source 126 is adjusted as required while it passes through a flow regulating valve 128 and an open/close valve 130. In addition, the processing gas is uniformly induced into the processing chamber 102 via a plurality of gas outlet holes 118a formed at the upper electrode 118. The atmosphere inside the processing chamber 102 is sustained at a specific reduced pressure through vacuum drawing achieved by a vacuum pump P 132 provided at a sidewall of the processing chamber 102.

Next, high-frequency power, e.g., 27.12 MHz, is applied to the upper electrode 118. The high-frequency power is supplied from a first high-frequency source 134 via a first matcher 136. In addition, high-frequency power with the frequency at, for instance, 800 kHz is applied to the lower electrode 106 at the same time. This high-frequency power is supplied from a second high-frequency source 138 via a second matcher 140. With power applied in this manner, the processing gas is raised to plasma to etch an SiO2 layer formed on the wafer W placed on the lower electrode 106.

2. Structures of Cylindrical Body and Second Ring-shaped Body

The cylindrical body 124 and the second ring-shaped body 116, which constitute the primary structural features of the present invention, are provided to ensure that plasma is prevented from becoming diffused to the inner wall surfaces of the processing chamber 102 and that the plasma is induced uniformly onto the wafer W during the etching process.

The cylindrical body 124 is constituted of an insulating material such as quartz and is formed in a roughly cylindrical shape. In addition, the cylindrical body 124 is provided at the ceiling of the processing chamber 102 around the first ring-shaped body 122, to face opposite the side walls of the processing chamber 102. The height of the cylindrical body 124 is set by ensuring that when the lower electrode 106 is elevated and set at the processing position, the cylindrical body 124 surrounds the second ring-shaped body 116 provided at the lower electrode 106. At the same time, the height of the cylindrical body 124 is set by ensuring that the cylindrical body 124 will not hinder the delivery of the wafer W when the lower electrode 106 is lowered and is set at the position at which the wafer W is mounted. Furthermore, the thickness of the cylindrical body 124 is set at a value that does not necessitate frequent replacement even when it is sputtered with plasma. The internal surface of the cylindrical body 124 is a smooth surface with practically no indentations or projections. By adopting such a structure, plasma us can be generated in a uniform manner. It is to be noted that the internal diameter of the cylindrical body 124 is to be described later.

The second ring-shaped body 116, which is constituted of an insulating material such as quartz, is formed in a roughly ring shape. The second ring-shaped body 116 is provided at the side wall of the lower electrode 106 via the insulating member 109 and is formed as a distended portion which projects out concentrically to the lower electrode 106 so as to surround the lower electrode 106. In addition, the second ring-shaped body 116 is positioned further inward relative to the cylindrical body 124 when the lower electrode 106 is set at the processing position. In this structure, a space 102a where plasma is generated (hereafter referred to as a "plasma space") is formed by the upper electrode 118, the lower electrode 106, the cylindrical body 124 and the second ring-shaped body 116 during the etching process.

The second ring-shaped body 116 is constituted of an upper ring-shaped body 116a and a lower ring-shaped body 116b. The upper ring-shaped body 116a is located under the focusing ring 114 mentioned earlier and is exposed to the plasma space 102a. For this reason, the thickness of the upper ring-shaped body 116a is set at a value which does not necessitate frequent replacement even if it is sputtered with the plasma, as in the case of the cylindrical body 124. It is to be noted that the external diameter of the upper ring-shaped body 116a is to be described later.

The lower ring-shaped body 116b is set below the upper ring-shaped body 116a. In addition, the external diameter of the lower ring-shaped body 116b is set smaller than the external diameter of the upper ring-shaped body 116a which is to be described later. By adopting this structure, the quantity of the material required to constitute the lower ring-shaped body can be minimized to reduce the initial cost. The upper end of the bellows cover 112 mentioned earlier is mounted under the lower ring-shaped body 116b.

In this structure, in which the second ring-shaped body 116 is constituted of two portions is adopted, only the upper ring-shaped body 116a needs to be replaced when the second ring-shaped body 116 becomes worn out. As a result, since it is not necessary to disengage the lower ring-shaped body 116b at which the bellows cover 112 is mounted, the maintenance work can be completed quickly. Furthermore, since the lower ring-shaped body 116b almost never needs to be replaced, the maintenance cost is reduced as well.

Now, the internal diameter of the cylindrical body 124 and the external diameter of the upper ring-shaped body 116a are explained. It is necessary to form a gas discharge path 142 through which the gas inside the plasma space 102a is discharged between the cylindrical body 124 and the upper ring-shaped body 116a during the process. In addition, if the conductance value of the gas inside the gas discharge path 142 is higher than the conductance value of the gas inside the plasma space 102a, the entire surface of the wafer W can be processed uniformly, since the quantity of gas discharged from the plasma space 102a is regulated through the gas discharge path 142 to uniformly diffuse the processing gas inside the plasma space 102a and consequently to uniformly diffuse the plasma as well. Thus, it is desirable to set the distance between the cylindrical body 124 and the upper ring-shaped body 116a (second ring-shaped body 116) so as to allow formation of a gas discharge path 142 that will create the conductance difference described above.

Under normal circumstances, the distance between the upper electrode 118 and the lower electrode 106 is adjusted to optimize plasma in correspondence to the particulars of a given process. Consequently, the conductance in the gas discharge path fluctuates from process to process in the apparatus structure adopted in the prior art to result in plasma becoming unstable. However, in the implementation example, even if the distance between the upper electrode 118 and the lower electrode 106 is varied, the gas discharge path 142, which is formed by the cylindrical body 124 and the second ring-shaped body 116, remains unchanged. Thus, it is possible to maintain the conductance at a constant level regardless of the distance between the electrodes to stabilize the plasma.

As described above, the first ring-shaped body 122, the upper ring-shaped body 116a, the cylindrical body 124 and the focus ring 114 are exposed to plasma. For this reason, it is necessary to reduce the quantity of deposition adhering to the individual members in order to extend the maintenance cycle. Accordingly, the cylindrical body 124 and the upper ring-shaped body 116a are set at positions that will allow the first ring-shaped body 122, the upper ring-shaped body 116a, the cylindrical body 124 and the focus ring 114 to become heated to a specific temperature by the plasma. The specific temperature in this case should be a temperature, e.g., 150° C. or higher, which allows almost no deposition to adhere to the various members.

Thus, the internal diameter of the cylindrical body 124 and the external diameter of the upper ring-shaped body 116a are set so as to ensure that the distance between the cylindrical body 124 and the upper ring-shaped body 116a is sustained as described above and that the individual members are heated to the specific temperature. The diameters may be set either by setting the internal diameter of the cylindrical body 124 relative to the external diameter of the upper ring-shaped body 116a or by setting the external diameter of the upper ring-shaped body 116a relative to the internal diameter of the cylindrical body 124. It is to be noted that the conductance values mentioned above should be determined as appropriate for individual apparatuses in which the implementation example is adopted. In addition, the conductance values are set so as to set the pressure inside the plasma space 102a at a level corresponding to the process conditions. By adopting such a structure, both uniform processing and a reduction in the quantity of deposition are achieved.

3. Functions of a Cylindrical Body and Second Ring-shaped Body

First, the lower electrode 106 upon which the wafer W is placed is set at the processing position and the processing gas is induced into the plasma space 102a. At the same time, vacuum drawing is performed inside the plasma space 102a. This results in the processing gas flowing from the central area of the wafer W toward its circumferential edge due to the difference between the conductance of the gas inside the plasma space 102a and the conductance of the gas inside the gas discharge path 142. Thus, the processing gas can be uniformly induced onto the entire surface of the wafer W. Then, the gas having passed the circumferential edge of the wafer W is discharged through the gas discharge path 142.

Following the above, plasma is generated by applying high-frequency power to the upper electrode 118 and the lower electrode 106. The plasma is uniformly induced to the entire surface of the wafer W through the gas flow explained above. Consequently, uniform processing is enabled with identical processing performed at the central area and the circumferential edge of the wafer W. Furthermore, the presence of the cylindrical body 124 and the second ring-shaped body 116 does not allow the plasma to become diffused to the outside of the plasma processing space 102a readily.

Also, since the range over which plasma is generated is restricted by the cylindrical body 124 and second ring-shaped bodies 116, the plasma density is higher than that achieved in the apparatus in the prior art described earlier. This results in the cylindrical body 124, the first and second ring-shaped bodies 122 and 116 and the focus ring 114 becoming heated to the specific temperature mentioned earlier by the plasma.

4. Implementation

Figure 2A:
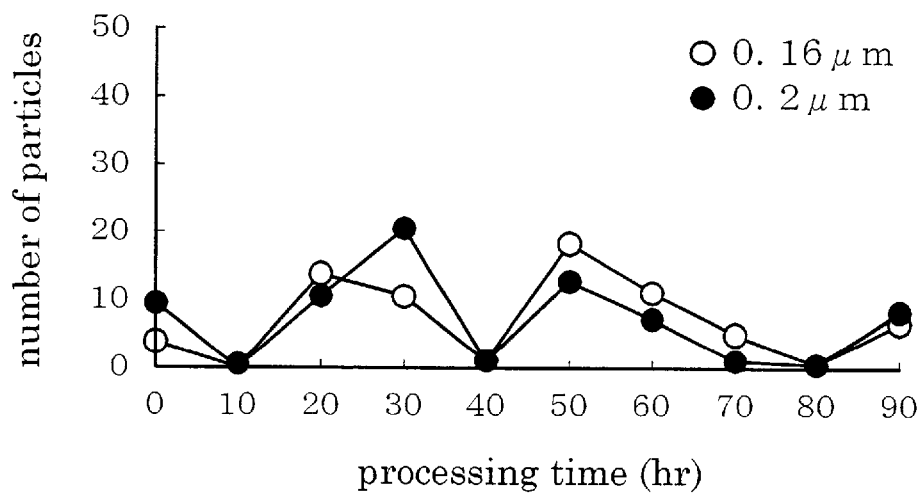
FIG. 2 schematically illustrates an implementation example achieved by performing a process with the etching apparatus shown in FIG. 1.
Figure 2B:
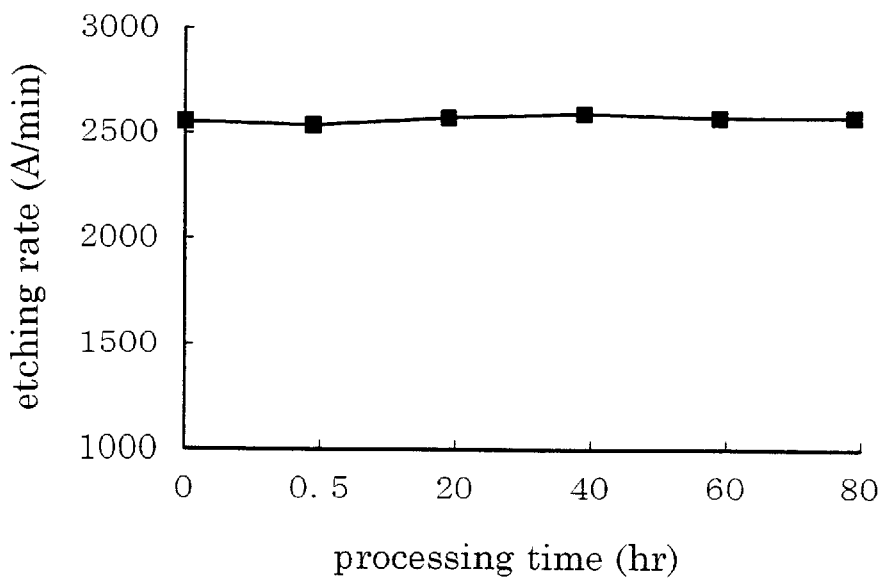

Next, in reference to FIG. 2, an example of implementation of the present invention is explained. It is to be noted that FIG. 2(a) schematically illustrates the relationship between the length of processing time and the number of particles. In addition, FIG. 2(b) schematically illustrates the relationship between the length of processing time and the etching rate. In addition, the individual results presented in FIGS. 2(a) and 2(b) are obtained by etching the wafer W with the etching apparatus 100.

FIG. 2(a) presents the average values of the numbers of particles suspended within the processing chamber 102 and within a delivery chamber (not shown) engaged in delivery/removal of a wafer W to/from the processing chamber 102. As FIG. 2(a) indicates, the number of particles is 30 or fewer that is considered not to affect the wafer W for at least 90 hours after the process starts. In addition, FIG. 2(b) presents the results of etching rate measurement performed over and 80 hour period following the process start. As the figure indicates, the etching rate does not become lowered over time as the etching process progresses and the etching rate immediately after the process start is maintained for at least 80 hours following the process start. Furthermore, the quantity of SiO2 constituting the etching layer at the wafer W that is etched in relation to the quantity of photoresist constituting the etching mask layer that is etched, i.e., the selection ratio, is increased.

While the invention has been particularly shown and described with respect to a preferred embodiment thereof by referring to the attached drawings, the present invention is not limited to this example and it will be understood by those skilled in the art that various changes in form and detail may be made therein without departing from the spirit, scope and teaching of the invention.

For instance, while an explanation is given above in reference to the implementation example on an example in which the first ring-shaped body and the cylindrical body are formed of separate members, the present invention is not limited to this structural example and may be adopted in a structure achieved by forming the first ring-shaped body and the cylindrical body as an integrated unit.

In addition, while an explanation is given above in reference to the implementation example on an example in which the second ring-shaped body is constituted of an upper ring-shaped body and a lower ring-shaped body, the present invention is not limited to this example and may be adopted in a structure achieved by forming the second ring-shaped body as an integrated unit or constituting the second ring-shaped body with three or more parts.

While an explanation is given above in reference to the implementation example on an example in which the first and second ring-shaped bodies and the cylindrical body are constituted of quartz, the present invention is not limited to this example and may be adopted in a structure in which the first and second ring-shaped bodies and the cylindrical body are constituted of any insulating material such as silicon, ceramic, fluor-resin or a polyimide resin.

According to the present invention, and deposition less readily occurs on the various members exposed inside the plasma space. As a result, particles are formed less readily, to achieve an improvement in yield. In addition, since the maintenance cycle is extended, an improvement in productivity is achieved. Furthermore, with plasma induced to the workpiece uniformly, uniform processing is achieved.

The entire disclosure of Japanese Patent Application No. 11-230567 filed on Aug. 17, 1999 including specification, claims, drawings and summary is incorporated herein by reference in its entirety.

What is claimed is:

1. A plasma processing apparatus comprising:
   a first electrode and a second electrode facing opposite each other inside a processing chamber;
   a gas supply system through which a processing gas is introduced into said processing chamber;
   a high-frequency power supply system that generates plasma by applying high-frequency power to at least either said first electrode or said second electrode;
   a first ring-shaped body that covers the circumferential edge of said first electrode;
   a cylindrical body that is provided around said first ring-shaped body to surround a workpiece during a plasma process;
   a second ring-shaped body that is provided around said second electrode and is positioned inside said cylindrical body during said plasma process,
   a gas discharge path that is formed between said cylindrical body and said second ring-shaped body at least during said plasma process, and wherein:
      the conductance value in said gas discharge path formed between said cylindrical body and said second ring-shaped body remains constant at least while said plasma processing is in progress, regardless of the distance between said first electrode and said second electrode.

2. A plasma processing apparatus according to claim 1, wherein:
   during said plasma process, the distance between said cylindrical body and said second ring-shaped body is set so as to ensure that the conductance value of the gas in said gas discharge path is higher than the conductance value of the gas in a space where said plasma is generated.

3. A plasma processing apparatus according to claim 1, wherein:
   said first ring-shaped body is provided at a wall surface of said processing chamber ranging from said first electrode to said cylindrical body.

4. A plasma processing apparatus according to claim 1, wherein:
   said first ring-shaped body is constituted of an electrically insulating material.

5. A plasma processing apparatus according to claim 1, wherein;
   said cylindrical body encloses said second ring-shaped body at least during said plasma process.

6. A plasma processing apparatus according to claim 1, wherein:
   the internal surface of said cylindrical body is formed as a smooth surface.

7. A plasma processing apparatus according to claim 1, wherein:
   said cylindrical body is constituted of an electrically insulating material.

8. A plasma processing apparatus according to claim 1, wherein;
   said second ring-shaped body is constituted as a distended portion projecting out from the periphery of said second electrode.

9. A plasma processing apparatus according to claim 1, wherein:
   said second ring-shaped body is constituted of an electrically insulating material.

10. A plasma processing apparatus comprising:
    a first electrode and a second electrode facing opposite each other inside a processing chamber;
    a gas supply system through which a processing gas is introduced into said processing chamber;
    a high-frequency power supply system that generates plasma by applying high-frequency power to at least either said first electrode or said second electrode;
    a first ring-shaped body that covers the circumferential edge of said first electrode;
    a cylindrical body that is provided around said first ring-shaped body to surround a workpiece during a plasma process;
    a second ring-shaped body that is provided around said second electrode and is positioned inside said cylindrical body during said plasma process,
    a gas discharge path that is formed between said cylindrical body and said second ring-shaped body at least during said plasma process, and wherein:
       the distance between said cylindrical body and said second ring-shaped body remains constant at least while said plasma processing is in progress, regardless of the distance between said first electrode and said second electrode.

11. A plasma processing apparatus according to claim 10, wherein;
    said cylindrical body can be replaced in the maintenance time.

12. A plasma processing apparatus according to claim 10, wherein
    the cylindrical body has a height and wherein the height does not hinder the delivery of the workpiece when the second electrode is lowered and set at the position at which the workpiece is mounted.

* * * * *